(12) United States Patent  (10) Patent No.: US 8,847,577 B2
Hamo  (45) Date of Patent: Sep. 30, 2014

(54) METHOD AND SYSTEM OF MEASURING CURRENT IN AN ELECTRIC METER

(75) Inventor: David Hamo, Morrisville, NC (US)

(73) Assignee: Sensus Spectrum LLC, Raleigh, NC (US)

( * ) Notice: Subject to any disclaimer, the term of this patent is extended or adjusted under 35 U.S.C. 154(b) by 453 days.

(21) Appl. No.: 12/849,877

(22) Filed: Aug. 4, 2010

(65) Prior Publication Data

US 2012/0032666 A1  Feb. 9, 2012

(51) Int. Cl.
*G01R 19/18* (2006.01)
*G01R 1/20* (2006.01)
*G01R 35/00* (2006.01)
*G01R 19/00* (2006.01)

(52) U.S. Cl.
CPC .............. *G01R 1/203* (2013.01); *G01R 35/005* (2013.01); *G01R 19/0092* (2013.01)
USPC .......................................... 324/120; 324/157

(58) Field of Classification Search
None
See application file for complete search history.

(56) References Cited

U.S. PATENT DOCUMENTS

| | | | | |
|---|---|---|---|---|
| 4,197,582 A | * | 4/1980 | Johnston et al. ................. | 702/58 |
| 4,491,790 A | * | 1/1985 | Miller ............................. | 324/142 |
| 5,229,962 A | * | 7/1993 | Yuh et al. ....................... | 365/162 |
| 6,031,749 A | * | 2/2000 | Covington et al. .............. | 363/98 |
| 6,559,654 B2 | * | 5/2003 | Ho et al. ......................... | 324/623 |
| 7,112,949 B2 | * | 9/2006 | Voisine ........................ | 324/76.11 |
| 7,254,946 B1 | * | 8/2007 | Quinn et al. .................... | 60/505 |
| 2005/0237047 A1 | | 10/2005 | Voisine | |
| 2006/0074617 A1 | * | 4/2006 | Chakravarty et al. ........... | 703/13 |
| 2007/0001796 A1 | * | 1/2007 | Waffenschmidt et al. ..... | 336/223 |
| 2008/0246460 A1 | * | 10/2008 | Smith ......................... | 324/76.11 |
| 2009/0146658 A1 | * | 6/2009 | McDowell et al. ........... | 324/309 |
| 2011/0279133 A1 | * | 11/2011 | Harper et al. .................. | 324/691 |

OTHER PUBLICATIONS

PCT Search Report and Written Opinion dated Oct. 27, 2011.

* cited by examiner

*Primary Examiner* — Arleen M Vazquez
*Assistant Examiner* — Alesa Allgood
(74) *Attorney, Agent, or Firm* — Andrus Intellectual Property Law, LLP

(57) ABSTRACT

A method and system for measuring the current flowing through an electric meter. The electric meter includes a reactive sensor positioned in series with a bus bar contained in the meter. The reactive sensor includes an inductor and the voltage across the inductance is measured. A control unit contained in the electric meter calculates the current based on the detected voltage and the value of the inductor. The value of the inductor is determined by passing a reference current through the inductor at a known frequency, such as 50 Hz or 60 Hz, and the voltage drop across the inductor is measured. Once the value of the inductor is determined, the value is stored in the control unit.

13 Claims, 7 Drawing Sheets

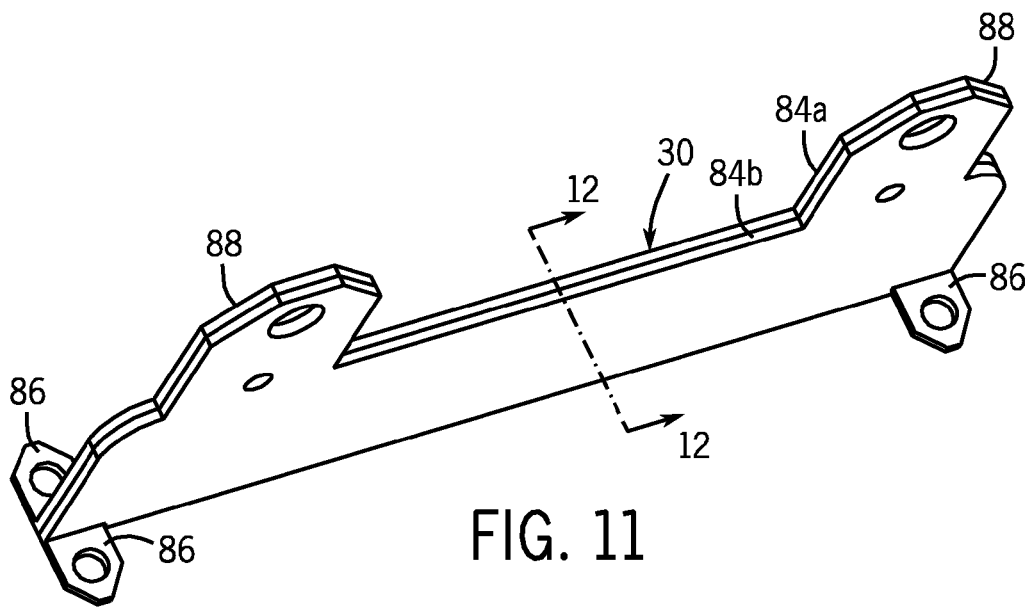
FIG. 11
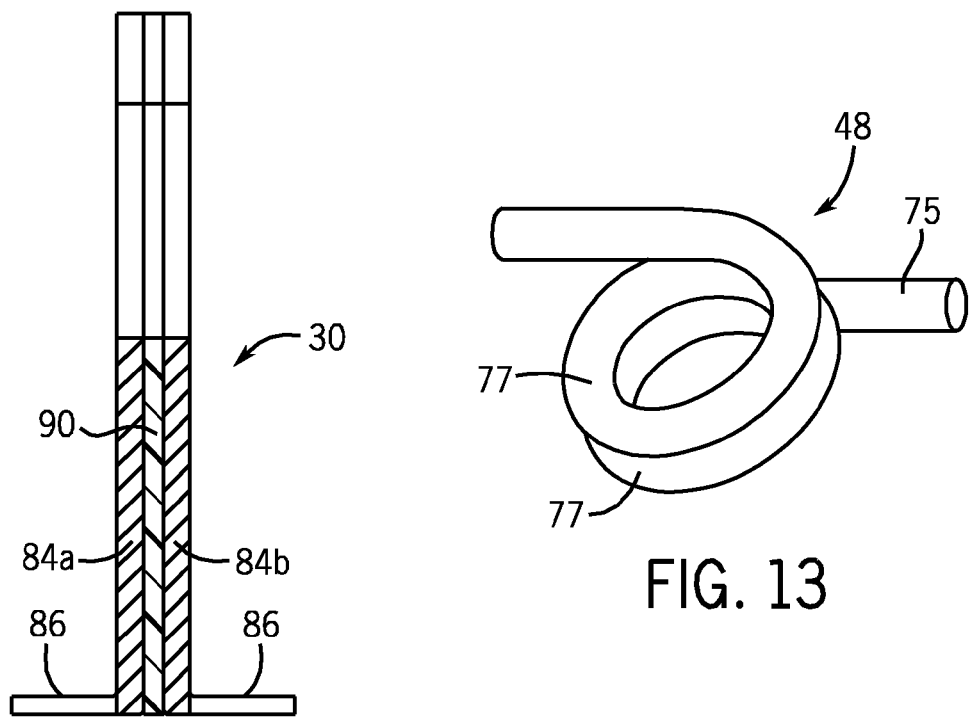
FIG. 12
FIG. 13

METHOD AND SYSTEM OF MEASURING CURRENT IN AN ELECTRIC METER

BACKGROUND OF THE INVENTION

The present disclosure generally relates to a system and method for measuring current in an electric meter. More specifically, the present disclosure relates to a system and method for measuring current in an electric meter using a reactive sensor.

Several methods are in use to measure current in an electric meter. These methods include Rogowski coils, current transformers and resistive shunts. Although each of these methods is useful in determining the amount of current flowing through an electric meter, each of the three currently available options add additional cost to the meter.

Presently, the lowest cost approach to accurately measure current in a production electric meter utilizes a resistive shunt. The amount of current flowing through the electricity meter is directed through the resistive shunt and the voltage across the resistive shunt is measured. Although this method is effective at measuring current, the resistive shunt eventually heats up and the resistance of the resistive shunt changes with the temperature change. Thus, temperature compensation is needed to overcome the effect of the change in resistance during the measurement period, which increases both the cost and complexity of the electric meter.

Additionally, in high power electric meters of 100 amps or more, the resistive shunt may dissipate too much power. While shunts of 25 micro ohms can be made to reduce power dissipation, measuring the voltage across such a small resistance is difficult and the cost of such device can be prohibitive. The present disclosure addresses many of these drawbacks of current sensing systems that are presently in use today.

SUMMARY OF THE INVENTION

The present disclosure relates to a monitoring system for measuring the amount of current flowing through an electric meter. The electric meter includes one or more bus bars that receive a supply of current from a utility power supply and directs the current to loads within the residence being serviced by the electric meter.

The electric meter includes a monitoring circuit that monitors the amount of current being used by the residence serviced by the electric meter. The monitoring circuit can monitor either a single phase or a three-phase power supply.

The monitoring circuit includes an inductor positioned in series with the current flowing through one of the bus bars. The current flowing through the bus bars passes through the inductor and generates a voltage across the inductor. A voltage detector included in the electric meter monitors the voltage across the inductor and a control unit contained within the electric meter calculates the current based upon the sensed voltage.

During calibration of the electric meter, a calibration circuit including a current source having a known value and phase directs a current through the electric meter. As the known current value is supplied to the electric meter, a calibration circuit determines the value of the inductor based upon the relationship between the voltage across the inductor and the current source.

In addition to determining the value of the inductance, the calibration circuit also determines the series resistance included in the inductor based upon the phase shift between the sensed voltage and the current supply. Based upon the phase shift, the calibration circuit determines the value of the series resistance. The value of the series resistance, the phase shift and the series inductance value are stored within memory of the control unit.

After the calibration process has been completed, the electric meter can be deployed and used to monitor the value of current drawn through each of the bus bars.

Various other features, objects and advantages of the invention will be made apparent from the following description taken together with the drawings.

BRIEF DESCRIPTION OF THE DRAWINGS

The drawings illustrate the subject matter of the present disclosure. In the drawings:

FIG. 11 is a perspective view of a bus bar constructed to include an inductor;

FIG. 12 is a section view taken along line 12-12 of FIG. 11; and

FIG. 13 is a perspective view illustrating another proposed type of inductor that can be used as part of the present disclosure.

DETAILED DESCRIPTION OF THE INVENTION

Figure 1:
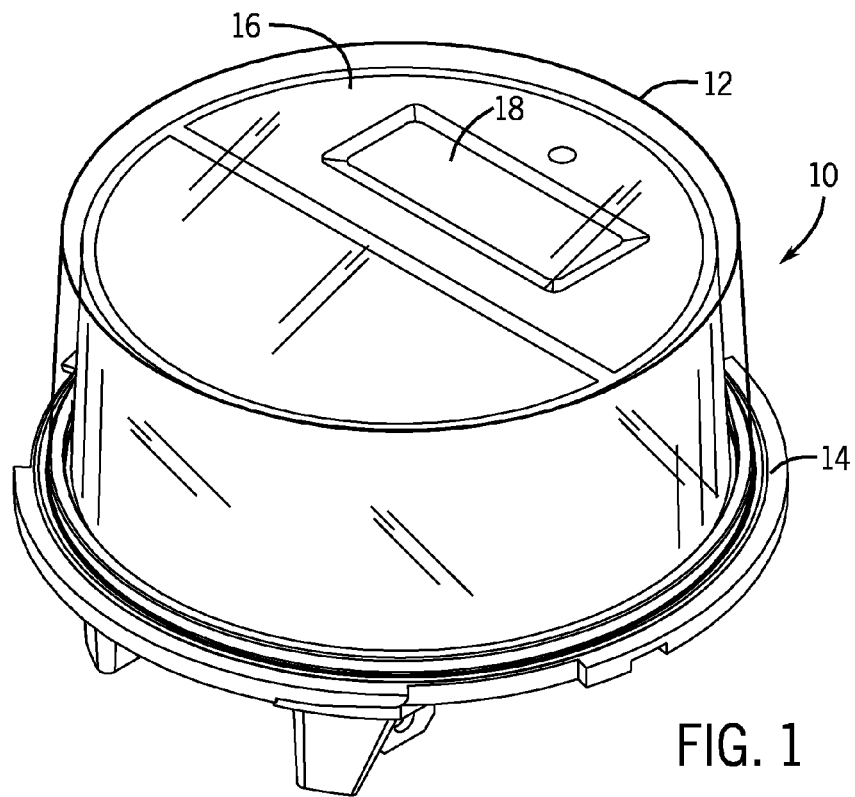
FIG. 1 is a perspective view of a three-phase electronic electricity meter of the present disclosure.

FIG. 1 illustrates a three-phase electronic electric meter 10 constructed in accordance with the present disclosure. The electric meter 10 includes an enclosed meter housing comprised of a cover member 12 mounted to a base member 14. The cover member 12 includes a generally clear face surface 16 that allows a digital display 18 to be read from the exterior of the electric meter 10. The cover member 12 and base member 14 are joined to each other in a conventional manner such that the base member 14 and the cover member 12 define a sealed, meter housing. The meter housing prevents moisture and other environmental contaminants from reaching the internal circuitry contained within the three-phase electric meter 10.

Figure 2:
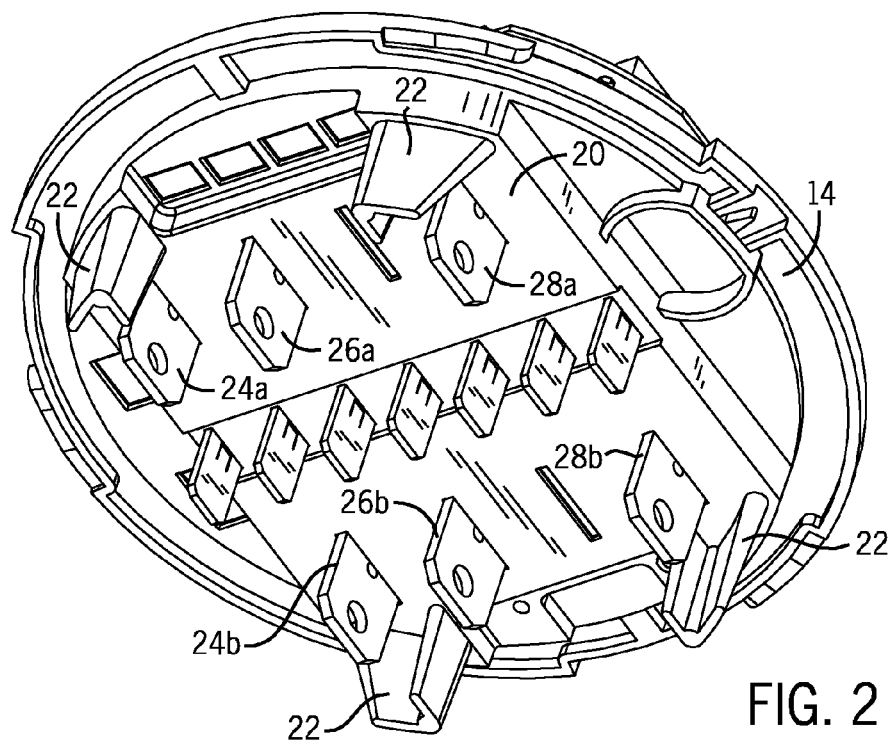
FIG. 2 is a back view of the three-phase electricity meter showing the ANSI-standard configuration of the current sensing blades of bus bars for each of the three phases of applied power.

Referring now to FIG. 2, thereshown is a bottom view of the base member 14 including a generally planar base plate 20 that is formed as part of the base member 14. The base plate 20 includes a plurality of support legs 22 spaced evenly around the base plate 20. The support legs 22 stabilize the electric meter when the electric meter is installed in a mating socket positioned in-line with a supply of electricity to either a residential or commercial location. The support legs 22 are typically formed from molded plastic and are formed integrally with the remaining portions of the base member 14.

Figure 3:
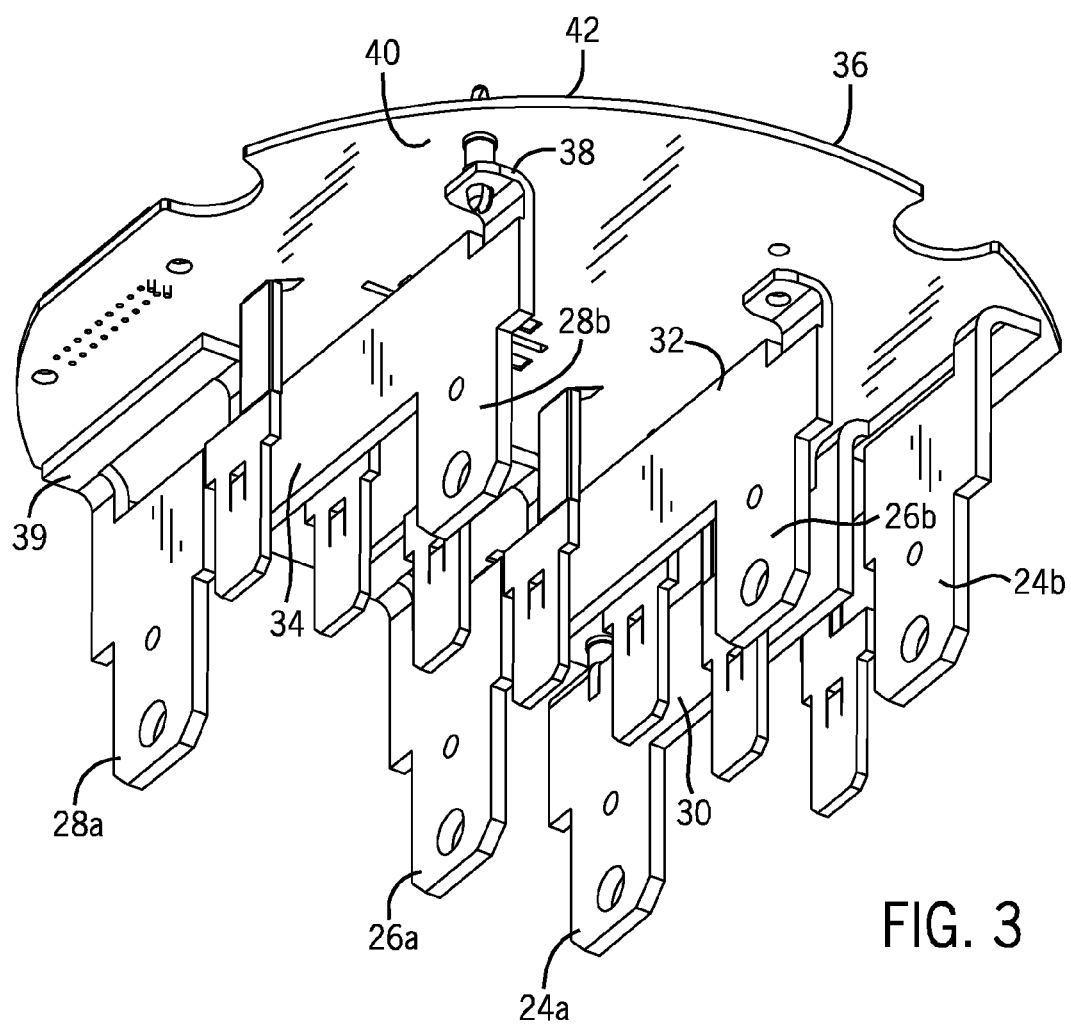
FIG. 3 is a perspective view showing the positioning of the current sensing bus bars and the metering circuit board.

As can be seen in FIG. 2, the base of the electric meter is configured to have a first pair of sensing blades 24a, 24b, a second pair of sensing blades 26a, 26b, and a third pair of sensing blades 28a, 28b. The sensing blades 24-28 are typically configured as current sensing blades and form part of three separate bus bars 30, 32 and 34, as shown in FIG. 3. As illustrated in FIG. 3, the bus bars 30, 32 and 34 are each securely mounted to a circuit board 36 by a support tab 38 and a sensing flange 39. The circuit board 36 includes a back support surface 40 as well as a front surface 42. The front face surface 42 of the circuit board 36 includes the measurement circuitry to be described in detail below that is operable to monitor the amount of electricity consumed by the facility that the electric meter 10 is servicing. The measurement circuitry mounted to the front face surface 42 includes a current sensing arrangement to be described below that senses the amount of current flow through the sensing flanges 39 of the bus bars 30, 32 and 34. The measurement circuitry includes a plurality of contact pads that extend through the thickness of the circuit board 36 such that a physical contact made to the sensing flange 39 along the back surface 40 to complete an electrical connection to the measurement circuitry mounted to the front face surface, as will be described in greater detail below.

Figure 10:
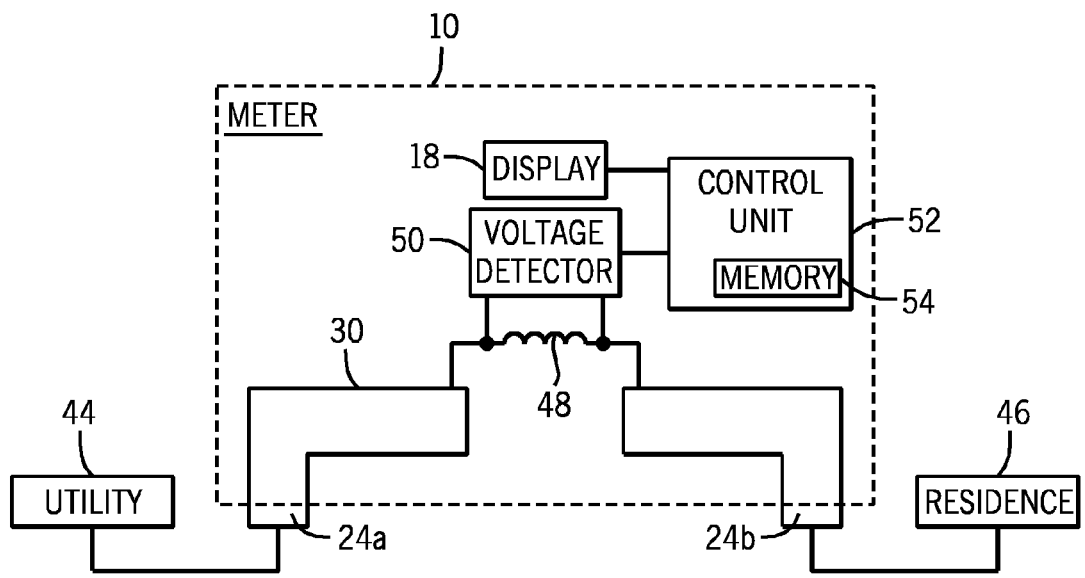
FIG. 10 is a block diagram of the components of the electric meter in accordance with the present disclosure.

FIG. 10 generally illustrates the position of the electric meter 10 between a supply of utility power 44 and multiple energy consuming loads contained within a residence 46. As illustrated in FIG. 10, power from the utility is received at the sensing blade 24a of one of the bus bars 30. Although only one of the bus bars 30 is shown in the embodiment of FIG. 10, it should be understood that in a three-phase electric meter, three separate bus bars are required, one for each of the phases of the three-phase power supply. FIG. 10 has been simplified to show only a single phase and thus only a single bus bar 30. The second sensing blade 24b of the bus bar 30 is connected to the residence 46 such that current flows through the bus bar 30 from the utility 44 to the residence 46.

As is well known, the meter 10 is positioned to sense the amount of current consumed by the residence 46. In the embodiment shown, an inductor 48 is positioned in series with the current flowing through the bus bar 30 and serves as a sensing element for the meter 10. The voltage across the inductor 48 is sampled by a voltage detector 50. In the embodiment illustrated, the voltage detector 50 is a 24 bit analog-to-digital converter that operates to sample the voltage across the inductor 48. The voltage sampled across the inductor 48 is communicated to a control unit 52 for the electric meter 10. The control unit 52 can be any type of processor, such as those currently utilized in electric meters. The control unit 52 includes internal memory 54 that stores the voltage measurement and information about the electric meter 10, including the determined value of the inductor 48. The value of the inductor 48 is determined during an initial calibration process, the details of which will be described in detail below.

Based upon the value of the voltage measured by the voltage detector 50, the control unit 52 utilizes the value of the inductor 48 to calculate the amount of current flowing through the bus bar 30. The amount of current flowing through the bus bar 30 is stored in the memory 54 and ultimately shown on the display 18.

In the illustration of FIG. 10, the voltage across the inductor 48 is developed based upon the formula:

$$V_L = I_L X_L \qquad \text{Eq. 1}$$

Figure 6:
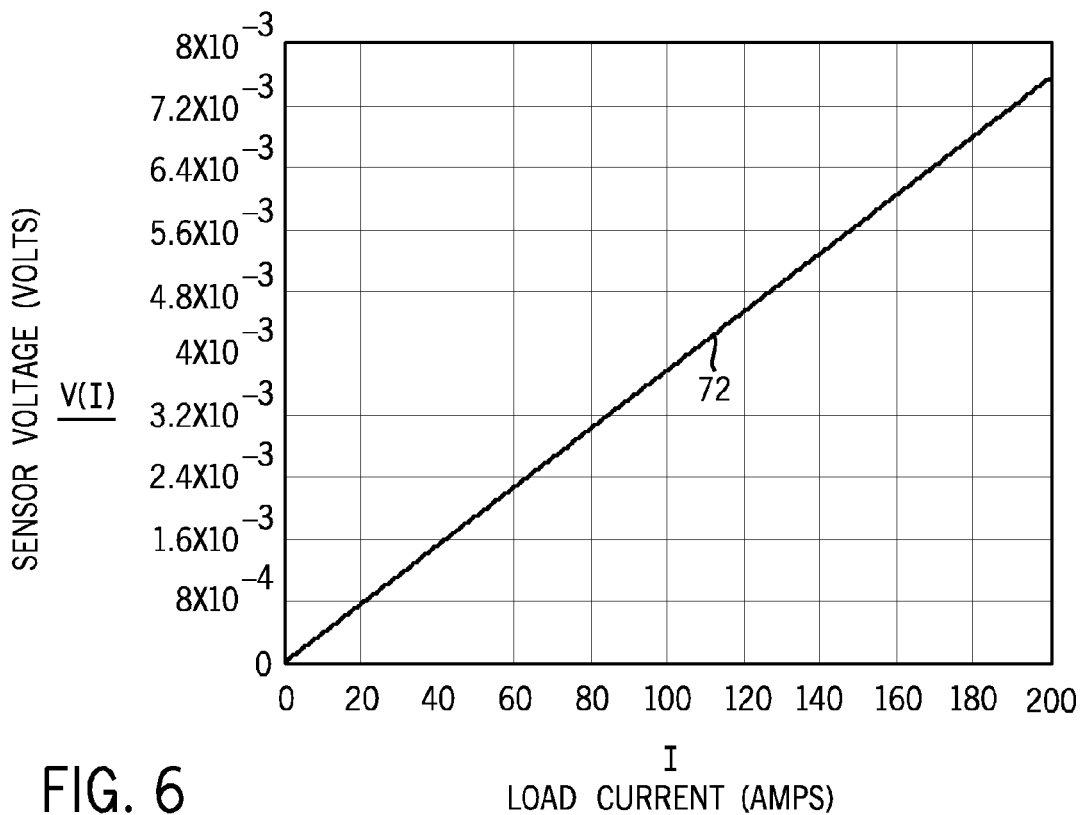
FIG. 6 is a graphical illustration of the relationship between the sensor voltage and the load current.

In the above equation, $X_L = 2\pi f L$, where f is the line frequency, L is the series inductance and I is the load current. The relationship between the voltage across the inductor and the current is shown in FIG. 6 by trace 72. As can be understood in FIG. 10, if the series inductance of the inductor 48 and the line frequency are known, the voltage detector 50 can determine the load current through the simple mathematical equation.

As an example, if the inductor 48 has an inductance of 133 nH, the voltage across the inductor measured by the voltage detector will be 10 mV at 200 amps. In a theoretical analysis that discounts any resistance in the inductor 48, the voltage across the inductor 48 will lead the current by 90°. However, as will be described in detail below, the inductor 48 does include a small resistance that changes the amount that the voltage leads the current, as will be described.

As described above, the voltage detector 50 can be a 24 bit analog-to-digital converter. If needed, an amplifier can be incorporated to amplify the voltage signal across the inductor 48 prior to sampling by the voltage detector 50. Such amplification may be required for low currents being drawn by the residence, such as a starting current.

Figure 4:
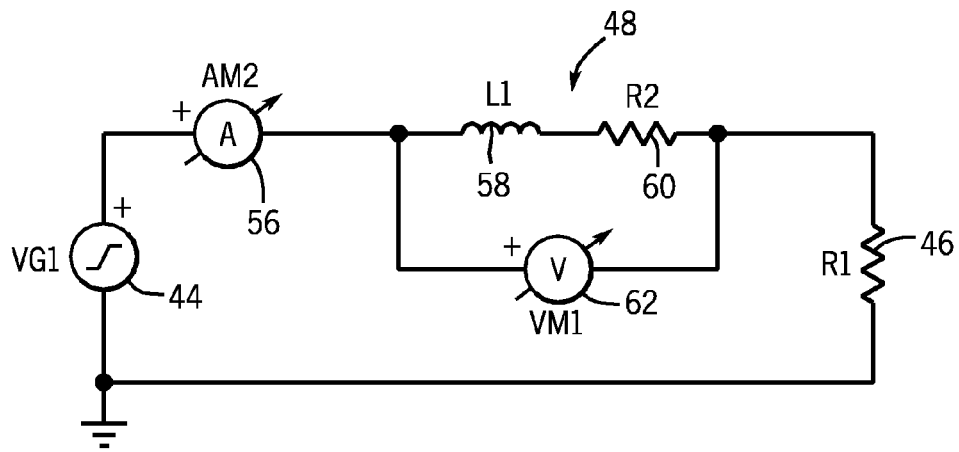
FIG. 4 is a schematic illustration of the current and measured voltage across an inductance placed in series with one of the bus bars.

FIG. 4 schematically illustrates the configuration of current flowing through one of the bus bars positioned between the load of the residence 46 and the utility voltage supply 44. The current being drawn by the load in the residence 46 is measured by a current meter 56. The current measured by current meter 56 flows through the inductor 48. The inductor 48 is represented in FIG. 4 by a series inductance 58 and a series resistance 60. Since all inductors include a metallic wire or a metallic trace formed on a circuit board, the metallic traces include a small resistance, which is graphically represented in FIG. 4 as the series resistance 60. In a system that is modeled without the series resistance 60, the current 56 lags behind the voltage 62 measured across the inductor 48 by 90°. In FIG. 4, the voltage across the inductor 48 is shown by a voltage meter 62.

Figure 5:
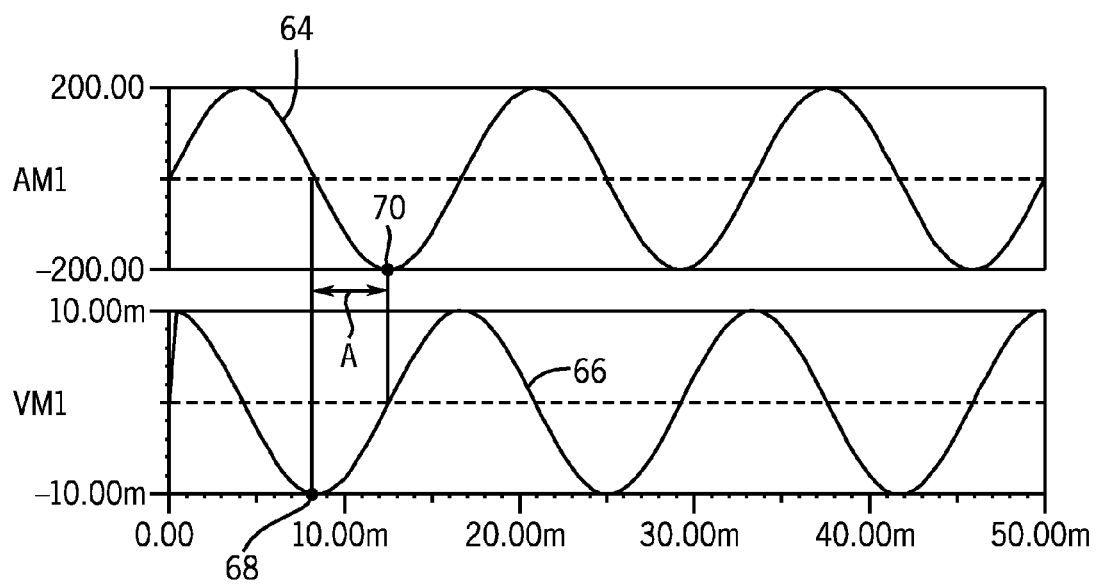
FIG. 5 illustrates the phase shift between the current flowing through the bus bar and the voltage across the series inductance.

FIG. 5 illustrates a current trace 64 that represents the measured load current 56 and a voltage trace 66 that represents the voltage 62 measured across the inductor 48. In a model in which the series resistance 60 is discounted, the voltage trace 66 leads the current trace 64 by 90°, as illustrated by reference numeral A in FIG. 5. As illustrated, the trough 68 of the voltage trace 66 is 90° ahead of the corresponding trough 70 of the current trace 64.

As previously described, although the voltage will lead the current by 90° in an embodiment in which the series resistance 60 is discounted, in practice, the series resistance 60 has a phase shifting effect on the current monitoring. Thus, during initial calibration of the electric meter including the inductor 48 shown in FIG. 10, the calibration process must both determine the value of the series inductance 58 as well as the value of the series resistance 60.

Initially, during the calibration process, a known current source is applied across each of the bus bars. The known current source has both a known current value as well as a fixed frequency. In one example, the testing current source can have a value of up to 200 amps and frequency of 60 Hz. A test frequency of 50 Hz could also be used.

Once the testing current is connected to the electric meter, the testing circuitry applies the current to the meter and measures the voltage across the inductor 48. As described previously, the voltage across the inductor 48 is directly related to the load current, as illustrated by trace 72 in FIG. 6. When both the voltage and current are known, the calibration circuitry is then used to calculate the series inductance 58 utilizing Eq. 1 along with the following equations:

$$V_R = I_L R_L \quad \text{Eq. 2}$$

$$V_{TOTAL} = Z_L I_L \quad \text{Eq. 3}$$

$$Z_L = R_L + jX_L \quad \text{Eq. 4}$$

Once the series inductance 58 is calculated, the series inductance is stored in memory 54 of the meter 10, as shown in FIG. 10. Although the series impedance 58+60 can be easily calculated by the voltage measured 62 divided by the current measured 56 using Eq. 3. The extraction of the inductive and resistive components can be done by determining the phase shift and from that angle the impedance can be broken down into pure resistance R and pure inductance L, and from that, the reactance component $X_L$ can be calculated from Eq. 1.

Figure 8:
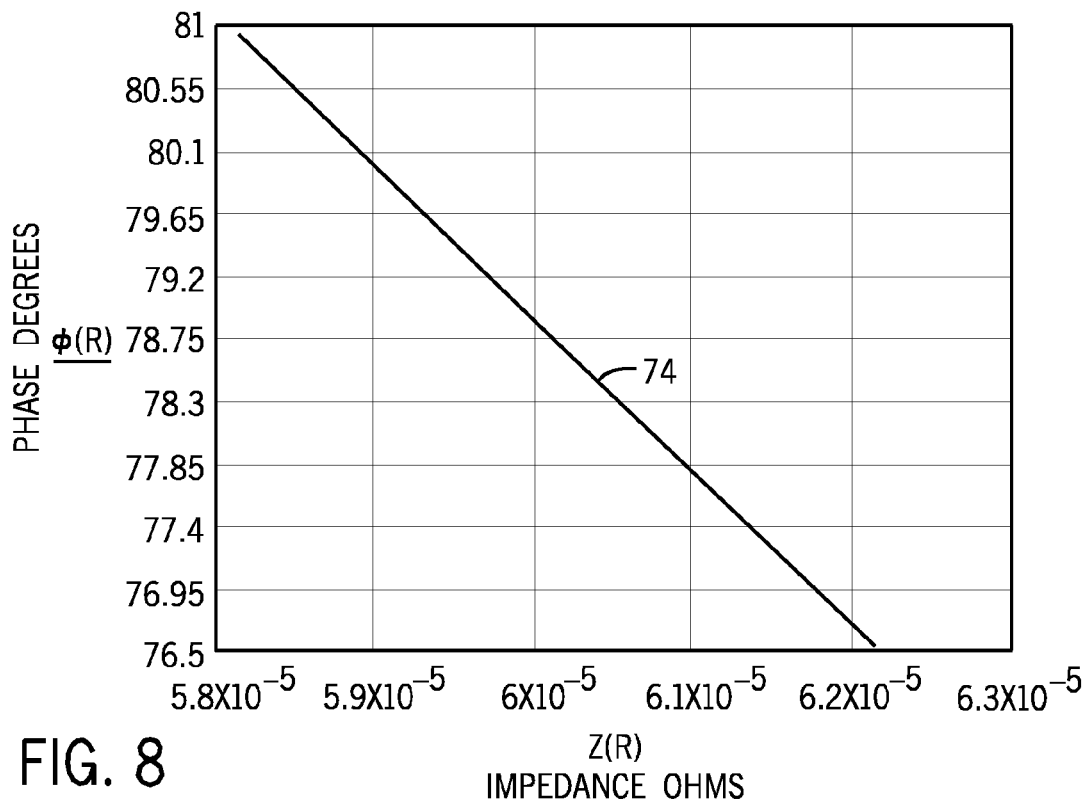
FIG. 8 is a graphical illustration of the phase shift vs. impedance, as a function of resistance.

During the calibration process, the known current source having a known current value and frequency is applied to the electric meter and the phase shift is determined between the load current through the inductor 56 and the voltage across the inductor 48. As illustrated in FIG. 8, the value of the series resistance 60 can be determined based upon the phase difference between the load current and the voltage across the inductor, as shown by trace 74. As an example, if the phase difference between the load current and the voltage across the inductor is known, the resistive component of the inductor impedance Z(R) can be determined. Likewise, the inductive component of the impedance $Z(X_L)$ can also be determined based on the phase difference between the load current and the voltage across the inductor. Since the frequency is known and the series impedance 48 has been previously determined, the calibration process can determine the phase shift between the load current and the voltage across the inductor, which results in the calculation of the series resistance 60 and the series inductance 58.

Figure 7:
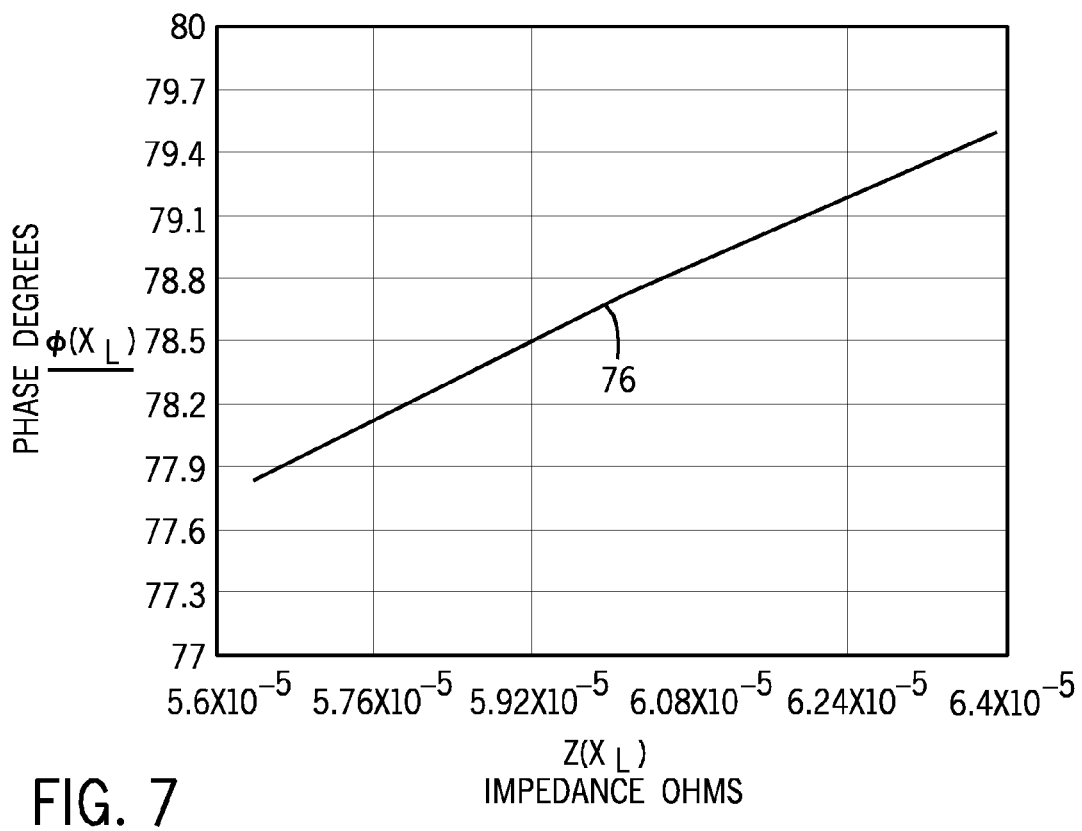
FIG. 7 is a graphical illustration of the phase shift vs. impedance, as a function of inductance.

FIG. 7 illustrates a trace 76 showing the relationship between the phase shift and the inductor impedance $Z(X_L)$ while holding the resistive component constant. The graphs in FIGS. 7 and 8 thus illustrate the phase shift caused by the varying series resistance 60 and the varying inductance 58 from some known initial value. The phase shift, the value of the series resistance 60 and the value of the series inductance 58 are all stored in the memory 54 of the control unit 52 shown in FIG. 10.

Referring back to FIG. 10, the series inductor 48 can be incorporated into the electric meter in many different manners. In one embodiment shown in FIG. 13, the inductor 48 could be formed from a wire 75 having multiple coils 77. In the embodiment illustrated, the wire 75 is a solid piece of tin plated copper that is bent into the multiple coils shown in FIG. 13. The spacing between the coils, the diameter of the wire and the diameter of each of the coils 77 controls the inductance created by the wire 75 and the coils 77.

Figure 9A:
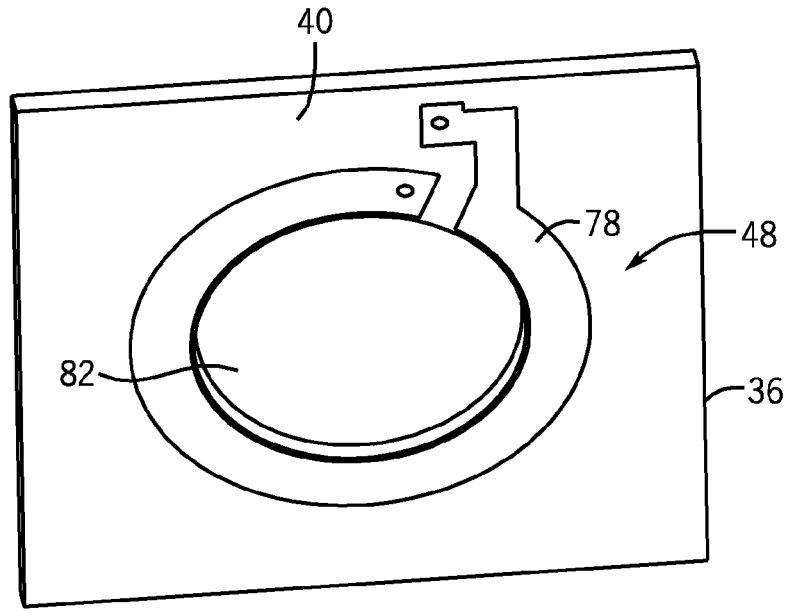
FIGS. 9a and 9b illustrate one type of inductor that can be formed as part of the circuit board.
Figure 9B:
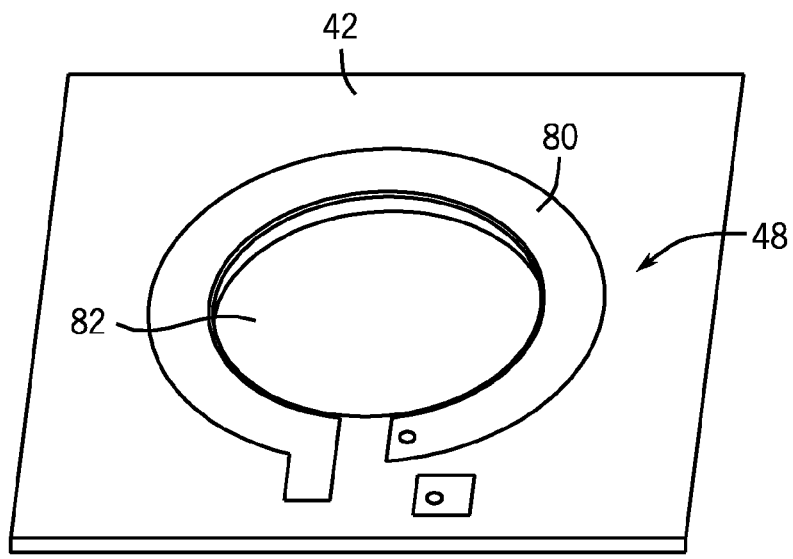

Referring now to FIGS. 9a and 9b, thereshown is another alternate embodiment of the inductor 48. In the embodiment shown in FIGS. 9a and 9b, the inductor 48 is formed as a first coil 78 (FIG. 9a) and a second coil 80 (FIG. 9b) formed on opposite sides of the circuit board 36. Each of the coils 78, 80 is formed by an imprinting process in which a metallic material is imprinted onto either the back surface 40 or the front surface 42 of the circuit board 36. The pair of traces is preferably formed from a copper material and is joined to each other to define a pair of coils. Each coil surrounds an open air core 82. As can be understood in FIGS. 9a and 9b, the open air core 82 is formed from a removed portion of the circuit board 36. The pair of coils 78, 80 formed on any portion of the circuit board will provide both an economical and small component for the monitoring circuit.

In yet another alternate embodiment, the inductor 48 shown in FIG. 10 could be formed as part of the bus bar and the voltage across the inductor measured by the voltage detector 50. FIG. 11 illustrates one embodiment in which the inductor is formed as part of the bus bar 30. In the embodiment shown in FIG. 11, the bus bar 30 is formed from two identical plates 84a and 84b. The plates 84a, 84b are positioned adjacent to each other and combined to form the bus bar 30. Each of the plates 84a, 84b includes a pair of support tabs 86 that are used to attach the bus bar 30 to the underside of the circuit board in a similar manner as to the attachment of the bus bar shown in FIG. 3. The pair of plates 84a, 84b combines to form the pair of sensing blades 88.

Referring now to FIG. 12, when the bus bar 30 is constructed, a thin, dielectric spacer 90 is positioned between the pair of plates 84a and 84b. The dielectric spacer 90 introduces an inductance into the bus bar 30. The inductance is formed from the self inductance of the pair of plates 84a and 84b as well as the mutual inductance created by the current flowing through the separate plates of the bus bar 30. The combination of the self inductance and the mutual inductance results in the bus bar 30 having an inductance of approximately 100 nH. However, the material used to form the dielectric spacer 90 and/or the thickness of the spacer could be modified to chance the inductance of the bus bar 30 as desired.

When the bus bar 30 shown in FIGS. 11-12 is utilized in the electricity meter, the electricity meter is once again calibrated to determine both the series inductance 58 and series resistance 60 of the inductor (FIG. 4) created by the bus bar 30 in the manner described previously. Once these values are determined during the calibration process, these values are stored in the electricity meter as described.

Although various different types of inductors are described, it should be understood that the inductor 48 shown in FIG. 10 could be formed by any different type of method or process while operating within the scope of the present disclosure.

I claim:

1. A system for measuring the amount of current flowing from a utility source to one or more electric loads through at least one bus bar contained in an electric meter, the system comprising: an inductor positioned in series with the bus bar such that the current flowing to the one or more loads passes through the inductor; a voltage detector positioned to detect the voltage across the inductor created by the flow of current through the bus bar from the utility source to the one or more electric loads; a control unit coupled to the voltage detector and operable to calculate the current flowing through the bus bar of the electric meter from the utility source to the one or more electric loads based on the value of the inductor and the detected voltage; wherein the control unit is mounted to a circuit board contained within the electric meter, wherein the inductor is formed on the circuit board, wherein the inductor includes a plurality of turns; and wherein the inductor includes a combination of self-inductance and mutual inductance required to measure current.

2. The system of claim 1 wherein the value of the inductor is predetermined and stored in the control unit.

3. The system of claim 1 wherein the voltage detector includes an analog to digital converter.

4. A method of measuring the current flowing from a utility source to one or more electric loads through a bus bar of an electric meter, the method comprising the steps of: positioning an inductor in series with the bus bar contained in the electric meter such that the current flowing to the one or more loads passes through the inductor; detecting the voltage across the inductor created by the flow of current through the bus bar; calculating the current flowing through the bus bar of the electric meter based on the value of the inductor and the detected voltage; supplying a known reference current to the electric meter; detecting the voltage across the inductor; calculating the value of the inductor based on the known reference current and the detected voltage; wherein the known reference current supplied to the electric meter is supplied at a known frequency and the value of the inductor is calculated based on the known reference current, the known frequency and the detected voltage; storing the calculated value of the inductor in a control unit of the electric meter; and calculating the current based on the calculated value of the inductor, the known frequency and the detected voltage.

5. The method of claim 4 wherein the inductor is formed on the bus bar.

6. The method of claim 4 wherein the inductor is part of the bus bar construction.

7. The method of claim 4 wherein the inductor is between 100 nH and 200 nH.

8. The method of claim 4 further comprising the steps of: determining the phase shift between the current and the detected voltage; and storing the phase shift in the control unit.

9. The method of claim 4 wherein the current is calculated in a control unit mounted to a circuit board contained in the electric meter.

10. The method of claim 9 wherein the inductor is formed on the circuit board.

11. An electric meter for measuring the amount of current flowing from a utility source to one or more electric loads, comprising: at least one bus bar to connect the utility source to one or more electric loads, wherein the utility source has a frequency; an inductor positioned in series with the bus bar such that the current flowing to the one or more loads passes through the inductor; a voltage detector positioned to detect the voltage across the inductor created by the flow of current through the bus bar; a control unit coupled to the voltage detector and operable to calculate the current flowing through the electric meter based on the value of the inductor, the frequency and the detected voltage; wherein the control unit is mounted to a circuit board contained within the electric meter, wherein the inductor is formed on the circuit board; and wherein the voltage detector includes an analog to digital converter.

12. The electric meter of claim 11 wherein the value of the inductor is predetermined and stored in the control unit.

13. The electric meter of claim 11 wherein the inductor includes a plurality of turns.

\* \* \* \* \*